(12) United States Patent
Bai et al.

(10) Patent No.: US 8,901,721 B1
(45) Date of Patent: Dec. 2, 2014

(54) LEAD FRAME BASED SEMICONDUCTOR DIE PACKAGE

(71) Applicants: Zhigang Bai, Tianjin (CN); Jinzhong Yao, Tianjin (CN); Yuan Zang, Tianjin (CN)

(72) Inventors: Zhigang Bai, Tianjin (CN); Jinzhong Yao, Tianjin (CN); Yuan Zang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/972,885

(22) Filed: Aug. 21, 2013

(51) Int. Cl.
  *H01L 23/48* (2006.01)
  *H01L 23/495* (2006.01)
  *H01L 23/00* (2006.01)

(52) U.S. Cl.
  CPC .... *H01L 23/49517* (2013.01); *H01L 23/49575* (2013.01); *H01L 24/85* (2013.01)
  USPC .......................................... 257/666; 257/676

(58) Field of Classification Search
  USPC ............................ 257/666, 676, 787; 438/123
  See application file for complete search history.

(56) References Cited

U.S. PATENT DOCUMENTS

| | | | | |
|---|---|---|---|---|
| 5,250,841 | A | * | 10/1993 | Sloan et al. ................... 257/666 |
| 5,266,834 | A | * | 11/1993 | Nishi et al. .................... 257/706 |
| 5,375,320 | A | * | 12/1994 | Kinsman et al. ................ 29/827 |
| 5,640,746 | A | | 6/1997 | Knecht |
| 7,002,240 | B2 | | 2/2006 | Madrid |
| 7,102,214 | B1 | | 9/2006 | Miks |
| 7,834,429 | B2 | | 11/2010 | Uematsu |
| 2004/0140542 | A1 | | 7/2004 | Crane |
| 2004/0201080 | A1 | | 10/2004 | Basoor |
| 2007/0001278 | A1 | | 1/2007 | Jeon |
| 2008/0290487 | A1 | | 11/2008 | Zhao |
| 2010/0001386 | A1 | | 1/2010 | Misumi |

FOREIGN PATENT DOCUMENTS

JP  04180668  6/1992

* cited by examiner

*Primary Examiner* — Roy Potter
(74) *Attorney, Agent, or Firm* — Charles Bergere (57) ABSTRACT

A lead frame based semiconductor die package includes a lead frame having a die pad that supports a semiconductor die and lead fingers that surround the die and die pad. The die is electrically connected to the lead fingers with bond wires. The die and bond wires are covered with an encapsulant with ends of the lead fingers projecting out from the encapsulant. One set of the lead fingers are bent and project down and another set of the lead fingers are bent and project inwardly, and under a bottom surface of the encapsulant. The encapsulant includes a slot or groove for receiving the lead fingers of the second set.

20 Claims, 8 Drawing Sheets

LEAD FRAME BASED SEMICONDUCTOR DIE PACKAGE

BACKGROUND OF THE INVENTION

The present invention relates to a integrated circuit packaging and, more particularly, to packaging a lead frame based semiconductor die package.

A semiconductor die is a small integrated circuit formed on a semiconductor wafer, such as a silicon wafer. Such a die is typically cut from the wafer and packaged using a lead frame. The lead frame is a metal frame, usually of copper or nickel alloy, that supports the die and provides external electrical connections for the packaged die. The lead frame usually includes a flag (die pad), and associated lead fingers (leads). The semiconductor die is attached to the flag and bond or contact pads on the die are electrically connected to the lead fingers of the lead frame with bond wires. The die and bond wires are covered with an encapsulant to form a semiconductor die package. The lead fingers either project outwardly from the encapsulation or are at least flush with the encapsulation so they can be used as terminals, allowing the semiconductor die package to be electrically connected directly to other devices or to a printed circuit board (PCB).

Semiconductor die packages are being manufactured with an increased functionality to package pin count (external terminal or I/O count). This is partly because of improved silicon die fabrication techniques that allow die size reductions. However, the number of lead fingers is limited by the size of the package and the pitch of the lead fingers. In this regard, a reduced lead finger pitch generally increases the likelihood of short circuit faults particularly when the package is mounted to a circuit board.

One solution that may overcome or alleviate circuit board shorts due to reduced lead finger pitch is to space adjacent lead fingers in different planes. The mounting feet at the ends of adjacent lead fingers are spaced at different distances from the package housing and thus this increases the spacing of the circuit board pads to which the mounting feet are soldered. Although useful, the spacing of adjacent lead fingers in different planes can increase the manufacturing process complexity and requires accurate jig alignment and precision lead bending.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout.

Furthermore, terms "comprises," "comprising," or any other variation thereof, are intended to cover a non-exclusive inclusion, such that module, circuit, device components, method steps and structures that comprises a list of elements does not include only those elements but may include other elements not expressly listed or inherent to such module, circuit, steps or device components. An element or step proceeded by "comprises" does not, without more constraints, preclude the existence of additional identical elements or steps that comprises the element or step.

Certain features in the drawings have been enlarged for ease of illustration and the drawings and the elements thereof are not necessarily in proper proportion. Further, the invention is shown embodied in a quad flat pack (QFP) type package. However, those of ordinary skill in the art will readily understand the details of the invention and that the invention is applicable to all leaded package types and their variations.

In one embodiment, the present invention provides for a method of packaging a semiconductor die. The method includes providing an electrically conductive lead frame with a least one die pad, a frame member surrounding the die pad. There are a plurality of lead fingers attached to the frame member, and disposed between the frame member and die pad, such that each of the lead fingers has a proximal end near the die pad and a distal end located away from the die pad. The method also includes attaching a semiconductor die to the die pad and electrically coupling contact pads on the semiconductor die with respective proximal ends of the lead fingers. There is also performed a process of encapsulating at least the die, the die pad and the proximal ends of the lead fingers with an encapsulation material. The encapsulation material provides a housing with edges from which the lead fingers extend, and the housing has an underside that has a least one slot therein. The method further includes detaching the lead fingers from the frame member and bending the lead fingers into a first set and second set of lead fingers. The distal ends of the first set of lead fingers are located away from the housing, and the distal ends of the second set of lead fingers are located at least partially in the slot.

In another embodiment, the present invention provides for a semiconductor die package including a die pad and a first set of lead fingers that are spaced from and project outwardly from the die pad. The lead fingers have proximal ends close to the die pad and distal ends spaced from the die pad. There is a second set of lead fingers that are spaced from and project outwardly from the die pad. The second set of lead fingers also have proximal ends close to the die pad and distal ends spaced from the die pad. A semiconductor die is attached to the die pad and bonding pads on the semiconductor die are selectively electrically coupled to the proximal ends of the first and second sets of lead fingers with bond wires. There is an encapsulation material covering the bond wires, the semiconductor die and the proximal ends of the first and second set of lead fingers. The encapsulating material provides a housing with edges from which the first set and second set of lead fingers extend. The housing has an underside that has a least one slot therein and wherein distal ends of the first set of lead fingers are located away from the housing and the distal ends of the second set of lead fingers are located at least partially in the slot.

Figure 1:
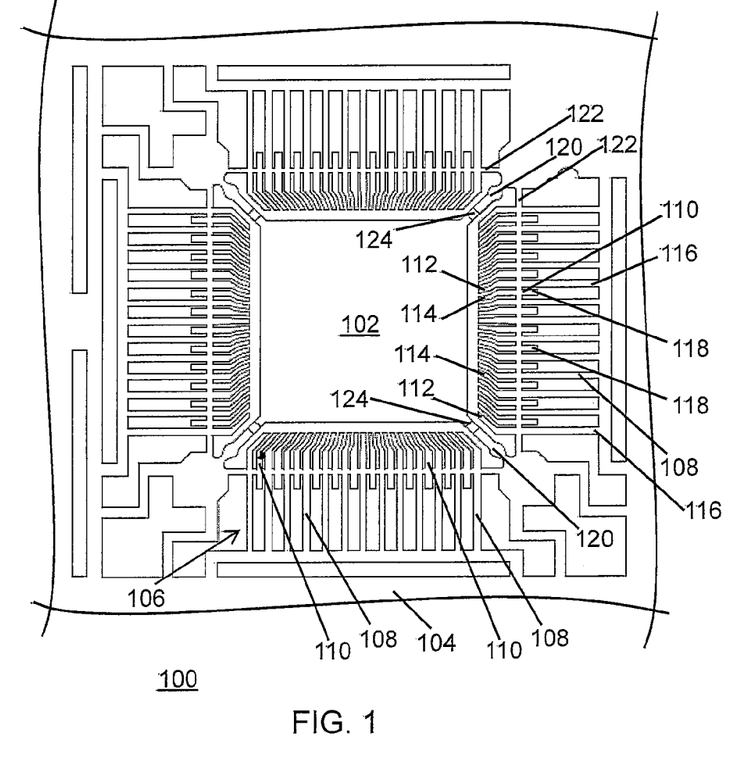
FIG. 1 is a plan view of an electrically conductive lead frame in accordance with a preferred embodiment of the present invention.

Referring now to FIG. 1, there is illustrated a plan view of an electrically conductive lead frame 100 in accordance with a preferred embodiment of the present invention. The lead frame 100 is part of a lead frame sheet and the lead frame 100 has a die pad 102, a frame member 104 surrounding the die pad 102 and a plurality of lead fingers 106 attached to the frame member 104. In this particular embodiment, the lead frame 100 has two sets of distinguishable lead fingers 106 which are a first set of lead fingers 108 and second set of lead fingers 110.

The lead fingers 106 are disposed between the frame member 104 and the die pad 102 such that each of the lead fingers 106 has a proximal end 112, 114 near the die pad 102 and a distal end 116, 118 located away from the die pad 102. As illustrated in this particular embodiment, each member of the second set of lead fingers 110 is shorter than each member of the first set of lead fingers 108, and the first set of lead fingers 108 has distal ends 116 at the frame member 104. In contrast, the second set of lead fingers 110 has distal ends 118 spaced the frame member 104. Also, in this embodiment the proximal ends 112 of the first set of lead fingers 108 and proximal ends 114 of the second set of lead fingers 110 are spaced approximately at a constant distance from the die pad.

Struts 120 extend from the frame member 104 to attach and support the die pad 102 to the frame member 104. The struts 120 in combination with dam bars 122 support and attach the first and second set of lead fingers 108, 110 to the frame member 104. Furthermore, each of the struts 120 has an angled section 124 that downsets the die pad 102 relative to the lead fingers 106 as will be apparent to a person skilled in the art.

Figure 2:
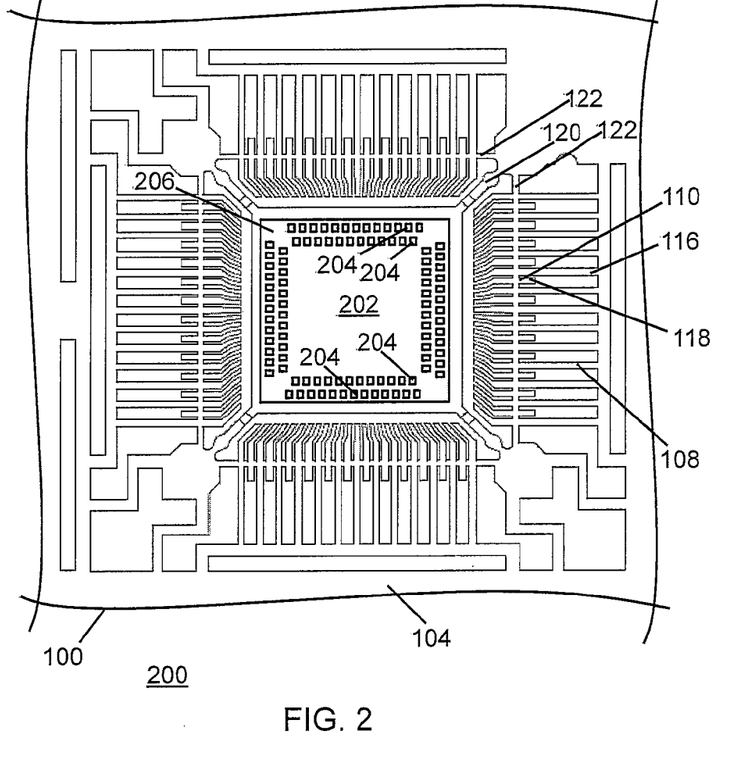
FIG. 2 is a plan view of partially assembled package, formed on the electrically conductive lead frame of FIG. 1, in accordance with a preferred embodiment of the present invention.

Referring to FIG. 2, a plan view of a partially assembled package 200, formed on the electrically conductive lead frame 100 in accordance with a preferred embodiment of the present invention, is illustrated. The partially assembled package 200 includes a semiconductor die 202 that is typically attached to the die pad 102 by a bonding agent (not shown). Also, as various size semiconductor dice are known, it is understood that the size and shape of the die pad 102 will depend on the particular semiconductor die 202. The semiconductor die 202 has contact pads 204 (that can be circuit electrodes) that are input, output or power supply nodes. These contact pads 204 are disposed on an upper or active surface 206 of the semiconductor die 202 as will be apparent to a person skilled in the art.

Figure 3:
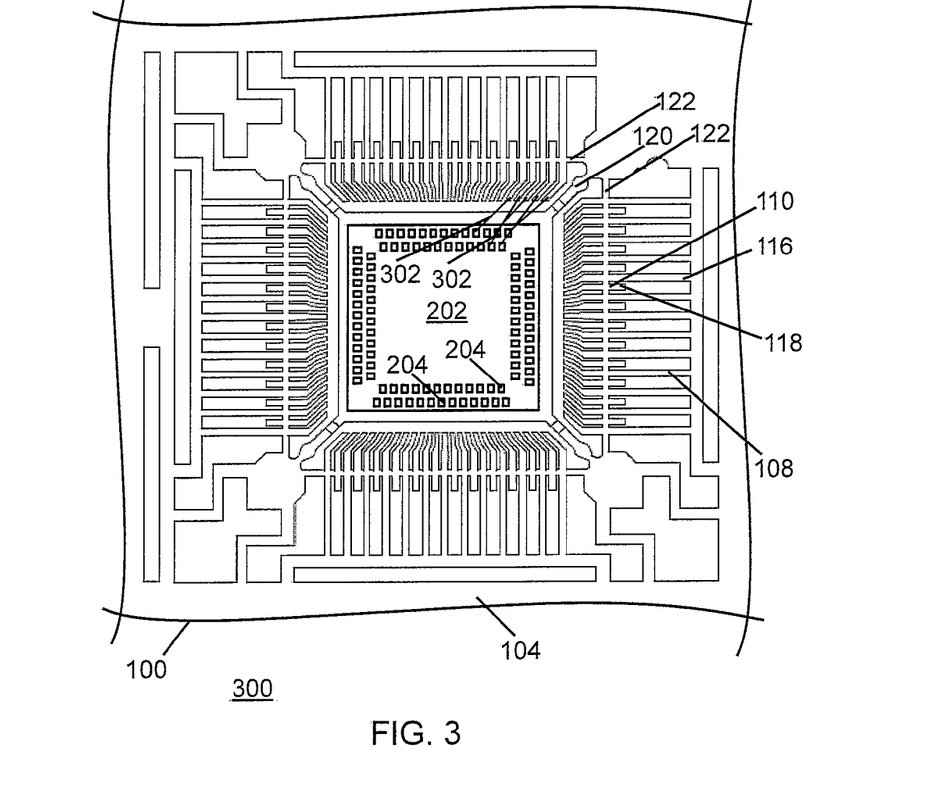
FIG. 3 is a plan view of a partially assembled electrically coupled package, formed from the partially assembled package of FIG. 2, in accordance with a preferred embodiment of the present invention.

FIG. 3 is a plan view of partially assembled electrically coupled package 300, formed from the partially assembled package 200 in accordance with a preferred embodiment of the present invention. As shown, the partially assembled electrically coupled package 300 has the contact pads 204 selectively electrically coupled (connected), by bond wires 302, to the proximal ends 112 of the first set of lead fingers 108 and the proximal ends 114 of the second set of lead fingers 110.

Figure 4:
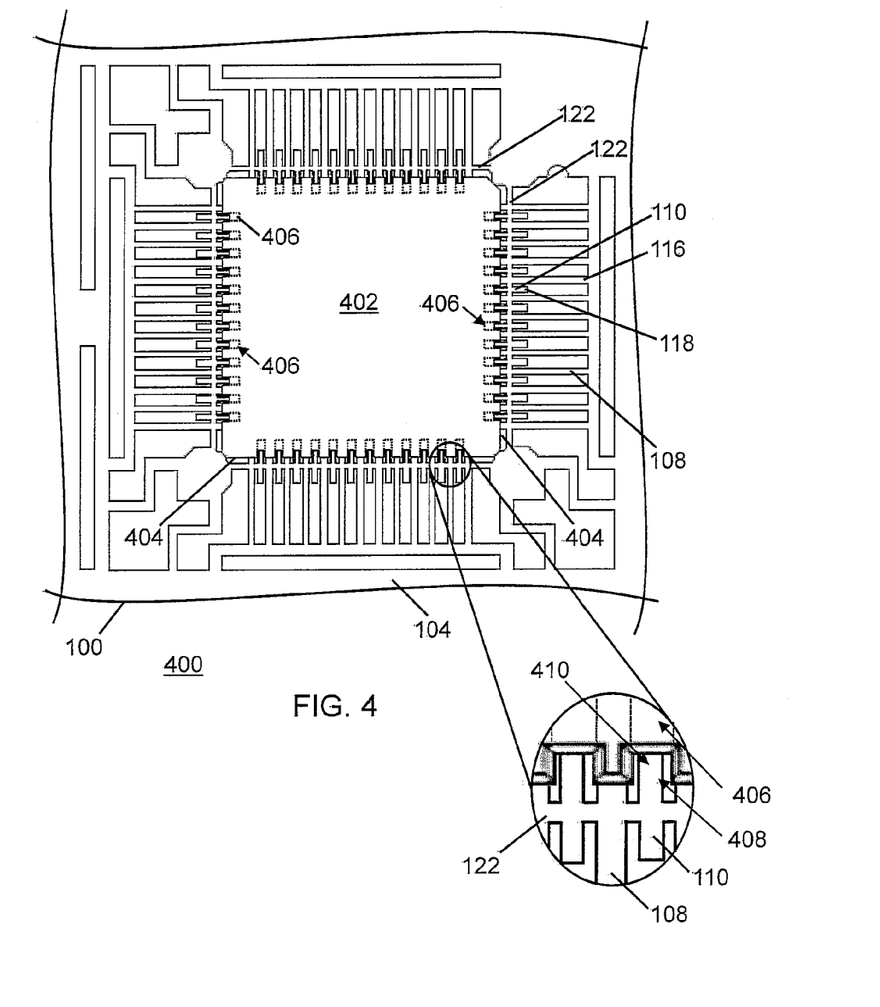
FIG. 4 is a plan view of an encapsulated semiconductor die package in accordance with a preferred embodiment of the present invention.

FIG. 4 is a plan view of an encapsulated semiconductor die package 400 in accordance with a preferred embodiment of the present invention. The encapsulated semiconductor die package 400 includes the package 300 after wire bonding has been completed for all the required contact pads 204. The encapsulated semiconductor die package 400 includes an encapsulating material that provides a housing 402 molded to the conductive lead frame 100 so that the housing 402 encapsulates the semiconductor die 202, die pad 102, the bond wires 302 and the proximal ends 112, 114 of the lead fingers 106.

The housing 402 has edges 404 from which the first set of lead fingers 108 and second set of lead fingers 110 extend. Also, an underside of the housing has slots 406 (shown in hidden detail, wherein the each of the slots 406 is adjacent a respective one of the edges 404. Furthermore, there are recesses 408 in respective edges 404 of the housing 402 and each of the recesses 408 is aligned with a respective slot 406 to thereby provide channels 410 for the second set of lead fingers 110. As illustrated in the magnified area, the recesses are tapered which allows easy access to the second set of lead fingers 110 during forming (bending) described later herein.

Figure 5:
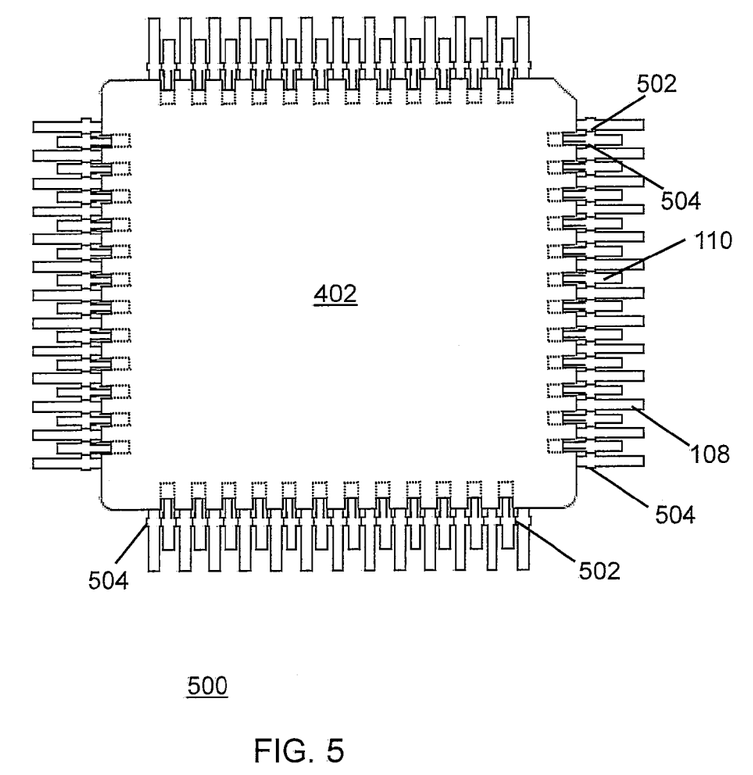
FIG. 5 is a plan view of a singulated semiconductor die package resulting after detaching lead fingers from a frame member of the lead frame of FIG. 1, in accordance with a preferred embodiment of the present invention.

FIG. 5 is a plan view of a singulated semiconductor die package 500 resulting after detaching the lead fingers 106 from the frame member 104, in accordance with a preferred embodiment of the present invention. As illustrated, the lead fingers 106 are separated from each other by cuts 502 in the dam bars 122 at locations between adjacent lead fingers 106. In this particular embodiment parts of the dam bars 122 remain as lateral protrusions 504 in the lead fingers 106, however the lateral protrusions 504 can be totally removed by suitable trimming (punching) during the detaching the lead fingers 106 from the frame member 104.

Figure 6:
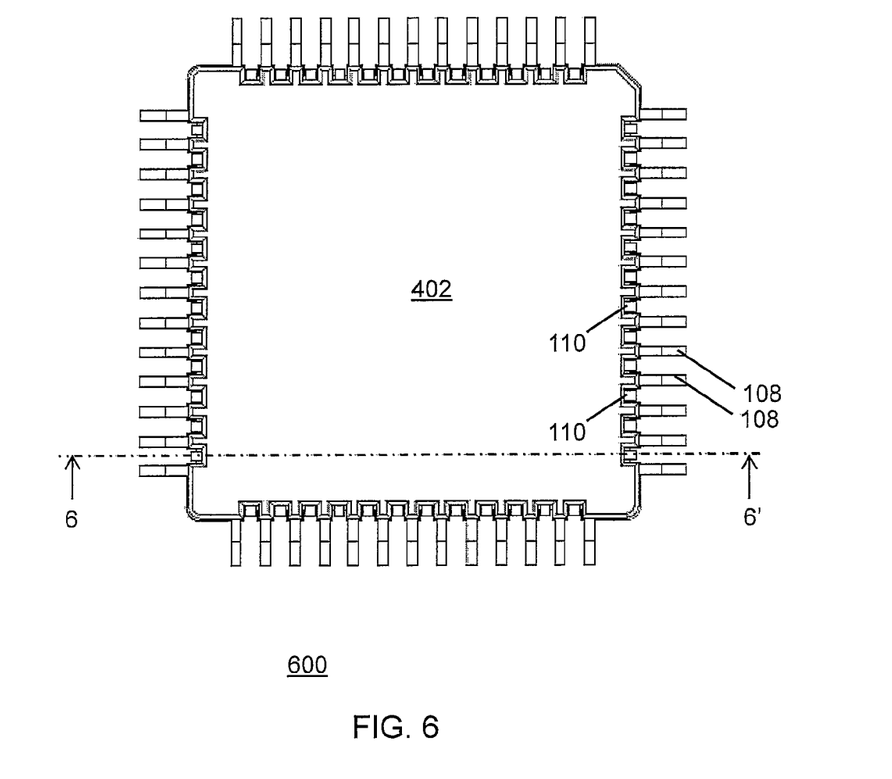
FIG. 6 is a plan view of a semiconductor die package after bending (forming) the lead fingers of the package of FIG. 5, in accordance with a preferred embodiment of the present invention.

FIG. 6 is a plan view of a semiconductor die package 600 after bending (forming) the lead fingers 106, in accordance with a preferred embodiment of the present invention. As shown, the first set of lead fingers 108 are interleaved with the second set of lead fingers 110. More specifically, members of the first set of lead fingers 108 are in an alternating arrangement with members of the second set of lead fingers 110. In this particular embodiment the lateral protrusions 504 have been removed by suitable trimming, however if the protrusions remain there would not be an issue with shorting of adjacent lateral protrusions 504 due to the bent configurations of the adjacent lead fingers 106.

Figure 7:
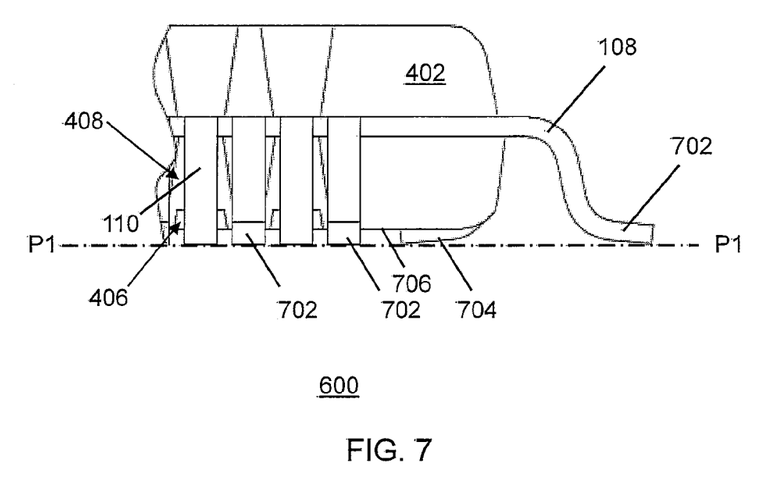
FIG. 7 is a side view of part of the semiconductor die package of FIG. 6.

FIG. 7 is a side view of part of the semiconductor die package 600. As shown, after bending (forming) of the lead fingers 106 distal ends 116 of the first set of lead fingers 106 are located away from the housing 402 and the distal ends 118 of the second set of lead fingers 108 are located at least partially in a respective slot 406. The first set of lead fingers 108 are bent so that they have mounting feet 702 at their distal ends 116 and the second set of lead fingers 110 are also bent so that they also have mounting feet 704 at their distal ends 116. The mounting feet 702, 704 are aligned in a seating plane P1 and since the feet 704 are located in the slots 406, in the underside 706 of the housing 402, the height of the package may be reduced slightly.

Figure 8:
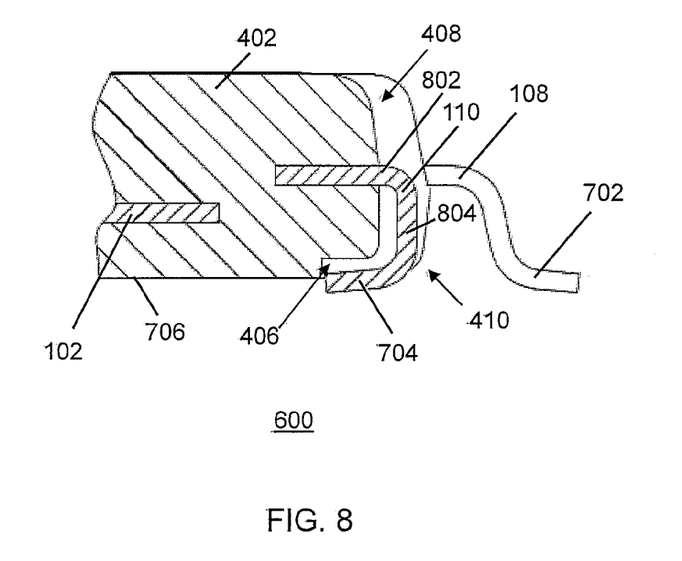
FIG. 8 is a cross sectional view of the semiconductor die package of FIG. 6, through 6-6'.

Referring to FIG. 8, a cross-sectional side view through 6-6' of part of the semiconductor die package 600 is shown. In this embodiment, each one of the first set of lead fingers 108 are spaced from and project outwardly from the die pad 102 and the proximal ends 112 are close to the die pad 102 and distal ends 116 (feet 702) are spaced from the die pad 102. Each one of the second set of lead fingers 110 is spaced from and project outwardly from the die pad 102 and the proximal ends 114 are close to the die pad 102 and distal ends (feet 704) are spaced from the die pad 102. More specifically, each one of the first set of lead fingers 108 is bent to have a first region 802 extending out of the housing 402 into a respective recess 408, an upright mid-region 804 in the respective recess 408 and the distal end 118 (mounting foot 704) that is located in a respective slot 406.

Figure 9:
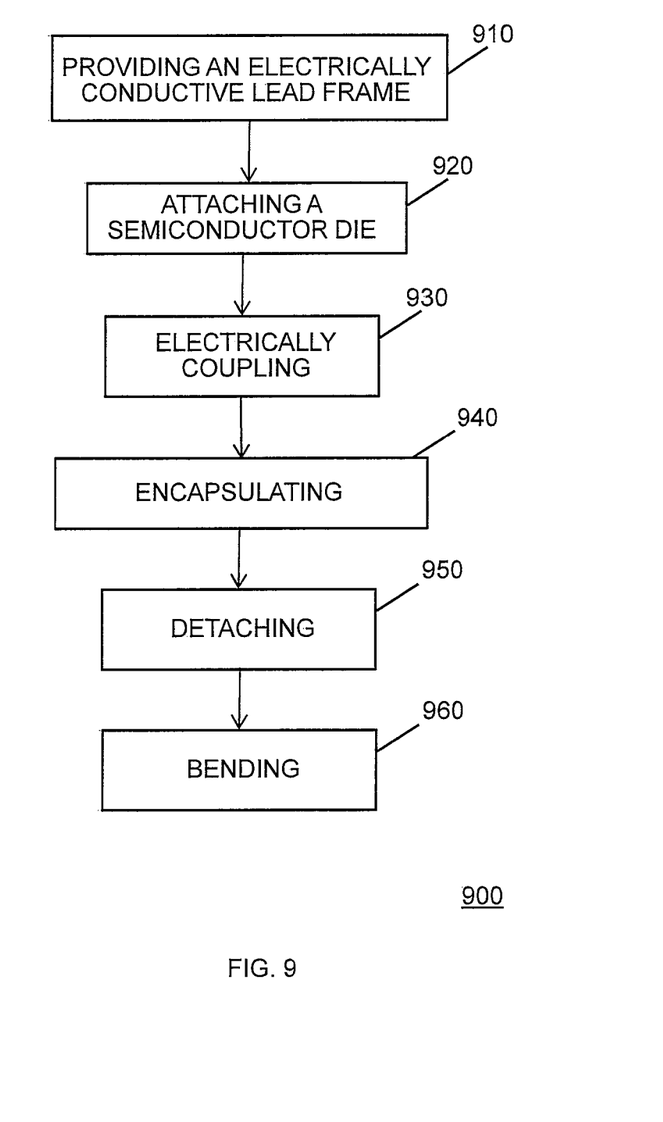
FIG. 9 is a flow chart illustrating a method of packaging a semiconductor die in accordance with a preferred embodiment of the present invention.

Referring to FIG. 9, a flow chart illustrating a method 900 of packaging a semiconductor die in accordance with a preferred embodiment of the present invention is shown. The method 900 will be described, where necessary, with reference to FIGS. 1 to 8 however, the method is not limited to the specific embodiments of FIGS. 1 to 8 as will be apparent to a person skilled in the art. The method 900 includes, at a block 910, providing the electrically conductive lead frame 100. At a block 920 there is performed attaching the semiconductor die 202 to the die pad 102 thereby resulting in the partially assembled package 200. At a block 930 there is performed a process of electrically coupling the contact pads 204 of the semiconductor die 202 with respective proximal ends 112, 114 of the lead fingers 106. This electrically coupling is typically performed by a conventional wire bonding process and results in the formation of the partially assembled electrically coupled package 300.

At a block 940, the method 900 performs encapsulating the die 202, the die pad 102 and the proximal ends 112, 114 of the lead fingers 106 with the encapsulation material to provide the housing 402. The housing 402 includes the edges 404 from which the lead fingers 106 extend and there may be individual slots (slots 406) in the underside 706 for each individual lead finger of the second set of lead fingers. Alternatively, there may be a continuous single slot on the underside 706 or a single slot on each edge of the underside.

At a block 950 a process of detaching the lead fingers from the frame member 104 is performed to provide the singulated semiconductor die package 500. The method 900, at a block 960, then performs bending the lead fingers into the first set 108 and second set of lead fingers 110 to provide the semiconductor die package 600 which is typically a Quad Flat type package.

Advantageously, the present invention potentially reduces or alleviates the possibility of short circuit faults between adjacent lead fingers 106 because the slots 406 and recesses 408 that form the channels 410 separate and provide an insulating barrier between adjacent lead fingers 106. The slots 406 have the further advantage of increasing the spacing of the circuit board pads to which the mounting feet are soldered, and the slots may also potentially reduce the height or footprint the semiconductor die package 600.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor die package, comprising:
   a die pad;
   a first set of lead fingers that are spaced from and project outwardly from the die pad, wherein the lead fingers have proximal ends close to the die pad and distal ends spaced from the die pad;
   a second set of lead fingers that are spaced from and project outwardly from the die pad, wherein the second set of lead fingers have proximal ends close to the die pad and distal ends spaced from the die pad,
   a semiconductor die attached to the die pad, wherein bonding pads on the semiconductor die are selectively electrically coupled to the proximal ends of the first and second sets of lead fingers with bond wires; and
   an encapsulation material covering the bond wires, the semiconductor die and the proximal ends of the first and second sets of lead fingers, wherein the encapsulating material forms a housing with edges from which the first and second sets of lead fingers extend, the housing having an underside that has a least one slot formed therein and wherein the distal ends of the first set of lead fingers are located away from the housing and the distal ends of the second set of lead fingers are located at least partially in the slot.

2. The semiconductor die package of claim 1, wherein the first and second sets of lead fingers are interleaved.

3. The semiconductor die package of claim 2, wherein members of the first set of lead fingers are in an alternating arrangement with members of the second set of lead fingers.

4. The semiconductor die package of claim 1, wherein each lead of the second set of lead fingers is located in the slot.

5. The semiconductor die package of claim 4, wherein the distal end of at least one of the lead fingers is located in the slot.

6. The semiconductor die package of claim 4, wherein there is more than one said slot and each slot has the distal end of one of the lead fingers located therein.

7. The semiconductor die package of claim 6, wherein respective edges of the housing include a recess, and a mid-region of each of the leads of the second set of lead fingers is located in a respective one of the recesses.

8. The semiconductor die package of claim 6, wherein each of the recesses is aligned with a respective said slot to thereby provide channels for the second set of lead fingers.

9. The semiconductor die package of claim 1, wherein each one of the second set of lead fingers is bent to have a first region extending out of the housing, an upright mid-region, and the distal end that is located in the slot.

10. A method of packaging a semiconductor die, comprising the steps of:
   providing an electrically conductive lead frame with a least one die pad, a frame member surrounding the die pad and a plurality of lead fingers attached to the frame member and disposed between the frame member and die pad such that each of the lead fingers has a proximal end near the die pad and a distal end located away from the die pad;
   attaching a semiconductor die to the die pad;
   electrically coupling contact pads on the semiconductor die with respective proximal ends of the lead fingers;
   encapsulating at least the die, the die pad and the proximal ends of the lead fingers with an encapsulation material, the encapsulation material forming a housing with edges from which the lead fingers extend, the housing having an underside that has a least one slot therein;
   detaching the lead fingers from the frame member; and
   bending the lead fingers into a first and second sets of lead fingers, wherein the distal ends of the first set of lead fingers are located away from the housing and the distal ends of the second set of lead fingers are located at least partially in the slot.

11. The method of packaging a semiconductor die of claim 10, wherein the detaching step includes separating the lead fingers from each other.

12. The method of packaging a semiconductor die of claim 10, wherein the first and second sets of lead fingers are interleaved in an alternating arrangement.

13. The method of packaging a semiconductor die of claim 10, wherein the distal end of each lead finger of the second set of lead fingers is located in the slot.

14. The method of packaging a semiconductor die of claim 10, wherein the distal end of at least one of the lead fingers is located in the slot.

15. The method of packaging a semiconductor die of claim 10, wherein there is more than one said slot and each slot has the distal end of one of the lead fingers located therein.

16. The method of packaging a semiconductor die of claim 15, wherein there is a plurality of recesses in a respective edge of the housing, and an upright mid-region of each of the leads of the second set of lead fingers is located in a respective one of the recesses.

17. The method of packaging a semiconductor die of claim 16, wherein each of the recesses is aligned with a respective said slot to thereby provide channels for the second set of lead fingers.

18. The method of packaging a semiconductor die of claim 16, wherein each of the lead fingers of the second set of lead fingers has a first region extending out of the housing and into a respective one of the recesses, the upright mid-region located in the respective one of the recesses, and the distal end located in the slot.

19. The method of packaging a semiconductor die of claim 10, wherein each member of the second set of lead fingers is shorter than each member of the first set of lead fingers.

20. The method of packaging a semiconductor die of claim 10, wherein the distal ends of the second set of lead fingers are spaced from the frame member.

\* \* \* \* \*